United States Patent [19]

Bader

[11] 4,302,804
[45] Nov. 24, 1981

[54] DC VOLTAGE MULTIPLIER USING PHASE-SEQUENCED CMOS SWITCHES

[75] Inventor: Clifford J. Bader, West Chester, Pa.

[73] Assignee: Burroughs Corporation, Detroit, Mich.

[21] Appl. No.: 72,145

[22] Filed: Sep. 4, 1979

[51] Int. Cl.³ .............................................. H02M 3/06
[52] U.S. Cl. ...................................................... 363/60
[58] Field of Search .................................... 363/60, 59

[56]  References Cited

U.S. PATENT DOCUMENTS

| | | | |
|---|---|---|---|
| 3,824,447 | 7/1974 | Kuwabara | 363/60 |
| 3,997,832 | 12/1976 | Tanaka et al. | 363/60 |
| 4,149,232 | 4/1979 | Eaton | 363/60 |
| 4,186,436 | 1/1980 | Ishiwatari | 363/60 |

FOREIGN PATENT DOCUMENTS 221073  9/1968  U.S.S.R. ................................ 363/59

Primary Examiner—A. D. Pellinen
Attorney, Agent, or Firm—Francis A. Varallo; E. M. Chung; K. R. Peterson

[57]  ABSTRACT

An electronic circuit is described for providing a low current DC supply at increased voltage with high efficiency and minimal hardware complexity. In performing its function, the circuit preferably utilizes a plurality of CMOS voltage-controlled solid state switches in conjunction with a sequenced clock pulse train to implement a compact capacitive-type multiplier. Thus, capacitors are charged in a predetermined order and the charges stacked upon one another to ultimately charge an output storage capacitor to a voltage level which is substantially a desired multiple of the supply voltage applied to the circuit. For descriptive purposes, the present inventive techniques are applied herein to the design for an octupler.

12 Claims, 3 Drawing Figures

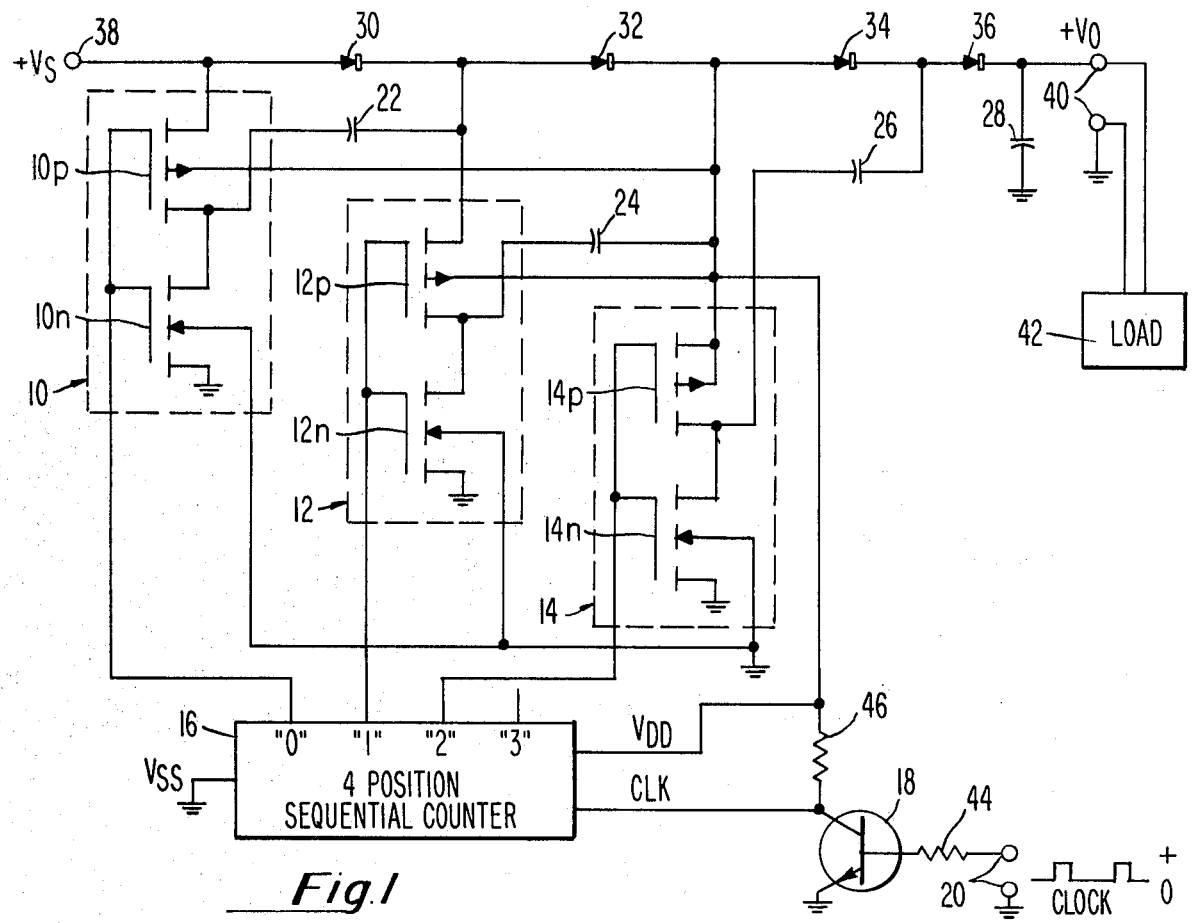
Fig.1
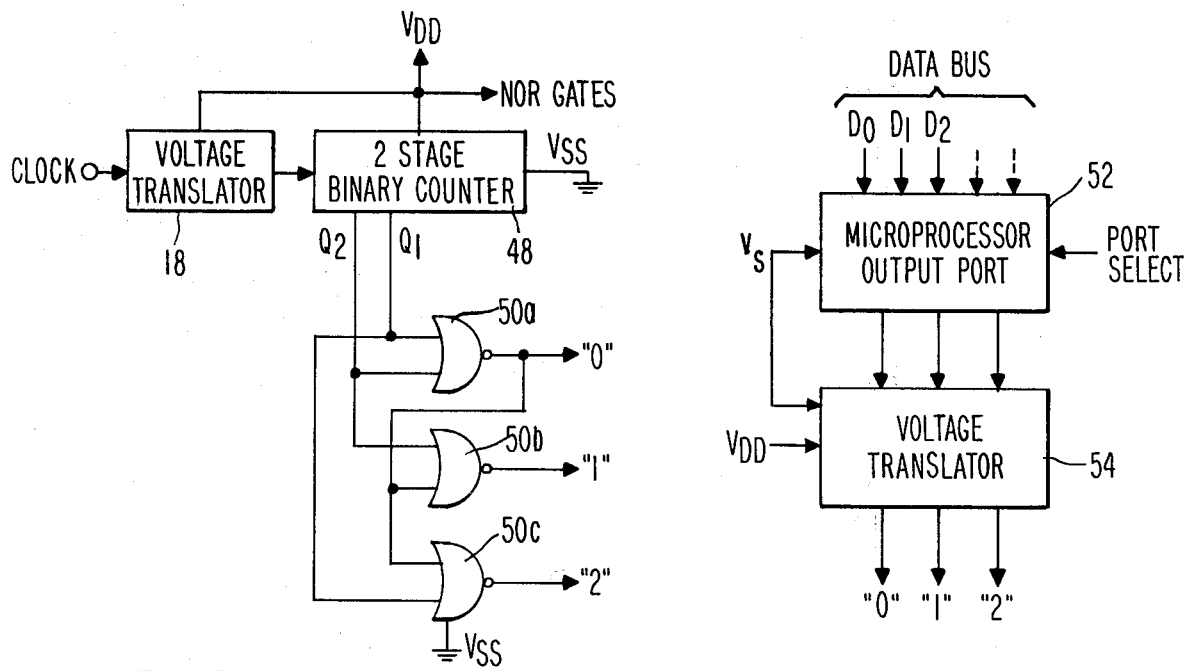
Fig.2
Fig.3

DC VOLTAGE MULTIPLIER USING PHASE-SEQUENCED CMOS SWITCHES

BACKGROUND OF THE INVENTION

DC voltage multiplication has been implemented by various types of DC-to-DC converters. The classic approach to such multiplication involves the use of an oscillator for converting the DC voltage to an alternating one, which is then stepped-up by a transformer and rectified to produce the higher DC level. An alternate method of multiplication in common use utilizes an oscillator and a diode-capacitor voltage multiplier. Each of these methods has deficiencies. The transformer type is adapted to higher power levels but tends to be bulky, costly and inefficient at light loads. The capacitive type, which may be designed for efficiency at light loads, has inherently poor regulation and limited power-handling capability. In general the well known voltage multiplier requires a plurality of capacitors and diodes, each equal in number to the degree of multiplication. For example, a voltage doubler requires two capacitors and two diodes, a tripler, three of each component. When considering higher levels of multiplication, such as an octupler, the component count becomes prohibitively large.

The availability of low-resistance CMOS voltage-controlled solid state switches and of low power digital circuits, including microprocessors, makes possible the mechanization of more compact capacitive type multipliers. At the same time, the low operating voltages of such digital circuits, typically of the order of five volts, creates a need for voltage multiplication when significant output energy is needed for interfacing with certain utilization devices. For example, electroexplosive devices are commonly initiated by discharge of a capacitor through a bridge wire surrounded by a heat-sensitive compound. It is desirable that the energy be delivered as rapidly as possible to minimize heat loss, that is, the RC time constant of the wire and storage capacitor should be as small as possible. This condition dictates the use of a small capacitor charged to a relatively high voltage. Furthermore, with relation to the capacitive storage of energy, any increase in voltage results in a much more sizeable decrease in the value of the required capacitance. Since the capacitor provides a reservoir of energy deliverable at a high rate, the voltage multiplier can operate at a very low current rate, that is, a rate sufficient to supply capacitor leakage current.

The present invention provides circuit means for charging a storage capacitor and maintaining the charge thereon, in a highly efficient manner and with a minimal component count. For example, in the octupler, chosen for purposes of disclosure hereinafter, the theoretical eight-fold multiplication of the supply voltage is achieved with four capacitors and four diodes, including the output storage capacitor. It should be understood however, that the basic techniques described herein are directly applicable to other levels of multiplication.

SUMMARY OF THE INVENTION

In accordance with the invention, an electronic circuit is provided for receiving a DC input supply voltage and for delivering a DC output voltage to a utilization device which is a multiple of the input voltage. The performance of this function is effected through the use of CMOS switches and a plurality of capacitors—the status of the switches at any given time being a function of a sequenced pulse train applied thereto. For example, the octupler chosen for purposes of example in teaching the principles of the invention, utilizes a four-phase clock, readily derived by way of a simple counter arrangement from a single-phase master clock. The sequential four-phase clock pulses are applied to the CMOS switches which are coupled to the capacitors. The opening and closing of selected CMOS switches results in the charging of certain capacitors and the stacking or adding of the charges, one on the other, in a predetermined fashion. A plurality of diodes link the multiplier stages.

In terms of the octupler, during the first of the four-phase clock cycle, a first capacitor is charged to substantially the magnitude of the supply voltage. In the second phase, and assuming circuit equilibrium has been attained, a second capacitor is charged to approximately twice the magnitude of the supply voltage. During the third phase, the CMOS switches permit the stacking of the first capacitor charge on the supply voltage and the second capacitor charge on that of the first capacitor, such that, a third capacitor is charged to approximately four times the amplitude of the supply voltage. Finally, the CMOS switch conditions in the fourth clock phase, cause the charge on the third capacitor to be stacked on the aforementioned potentials, thereby charging the output storage capacitor to a level which approximates eight times that of the supply potential. A utilization device may be coupled across the output storage capacitor terminals.

The foregoing operation is characterized by efficiency coupled with hardware simplicity. Other features and advantages of the present invention will become apparent in the detailed description appearing hereinafter.

BRIEF DESCRIPTION OF THE DRAWINGS

FIG. 1 is a schematic diagram of a preferred embodiment of the DC voltage multiplier of the present invention, illustrating an octupler.

FIG. 2 is a logic drawing of an alternate four-phase clocking method for use in the circuit of FIG. 1 and employing a two-stage binary counter and a two-input NOR gate decoding network.

FIG. 3 illustrates another clocking scheme for the circuit of FIG. 1 wherein the four-phase signals are developed in a microprocessor via software programming.

DESCRIPTION OF THE PREFERRED EMBODIMENT

With reference to FIG. 1, a specific DC voltage multiplier, that is, an octupler, has been chosen for purposes of description, although, as observed hereinbefore, the invention is not so limited. Three complementary MOS (CMOS) units, 10, 12 and 14 are illustrated. Each of these units includes a pair of compatibly fabricated N and P channel enhancement mode devices on a silicon substrate. All of the CMOS units may be regarded as having a common substrate. However, it should be understood that the invention is not restricted to such a configuration, but may employ for example, discrete MOS devices in accordance with particular operating requirements.

As seen in FIG. 1, CMOS unit 10 is comprised of a P channel device 10p, and a N channel device 10n. Similarly, 12p and 12n designate respectively P and N channel devices in CMOS unit 12; 14p and 14n appear in CMOS unit 14. The three CMOS units are disposed respectively in three succeeding stages of the octupler.

A four position sequential counter 16 is illustrated in FIG. 1. Counter 16 in conjunction with a voltage translator comprised of NPN transitor 18 and a source of single-phase master clock pulses appearing across terminals 20 selectively provides the control or gate signals for the CMOS units. The operation of the counter in controlling the CMOS unit switches is described hereinafter. For the present, it should be observed that the common pairs of gate electrodes of the devices of the CMOS units 10, 12 and 14 are connected respectively to the "0", "1" and "2" position terminals of the counter 16, while the "3" terminal is left "open". The four-phase sequential signals appear respectively on the last mentioned terminals.

In accordance with the circuit diagram of FIG. 1, the drain electrodes of each pair of P channel and N channel devices in each CMOS unit are connected to each other. The source electrodes of all of the N channel devices, namely 10n, 12n and 14n are connected in common to a reference potential, that is, ground.

A plurality of capacitors, 22, 24, 26 and 28 are provided. These capacitors are selectively charged in accordance with the switch conditions in the CMOS units as determined by the control signals from the sequential counter 16. Thus, capacitor 22 couples the common drain electrodes of devices 10p and 10n to the source electrode of device 12p. Similarly, capacitor 24 couples the common drain electrodes of devices 12p and 12n to the source electrode of device 14p.

In order to complete the capacitor charging paths, a plurality of diodes, namely 30, 32, 34 and 36 are provided. Diode 30 has its anode coupled in common to $V_s$, the supply voltage to be increased, appearing on terminal 38, and the source electrode of P channel device 10p. The cathode of diode 30 is coupled to the source electrode of defice 12p. Also, diode 32 couples the source electrode of P channel device 12p to the source electrode of device 14p. Diode 34 has its anode connected to the source electrode of P channel device 14p and its cathode connected in common to one side of capacitor 26. The other side of capacitor 26 is coupled to the common drain electrodes of devices 14p and 14n. The cathode of diode 34 is connected to one side of capacitor 28, the output storage capacitor, the other side of which is coupled to the reference potential. The octupler output voltage $V_o$, appears across terminals 40, to which a utilization device or load 42 may be coupled.

With respect to the electrical connections for the substrate electrodes for the P channel devices and the N channel devices, all of the former are returned to the potential $V_{dd}$ appearing on the source electrode of device 14p and all of the latter are returned to $V_{ss}$, the reference potential. Moreover, the sequential counter 16, utilizes both of the aforementioned potentials.

With continued reference to FIG. 1, the operation of the circuit is as follows. A series of clock pulses are applied via terminals 20 and resistor 44 to the base of transistor 18, which provides the required voltage translation to clock the counter 16. During the first phase of the four phases comprising a cycle of operation, the voltage level on the "0" terminal of counter 16 is high, and the "1" and "2" terminals are low. These conditions result in N channel device 10n being turned "on", that is, having low resistance, while P channel device 10p is "off", offering high resistance. Moreover, devices 12p and 14p are "on"; devices 12n and 14n, "off". Capacitor 22 is thus charged via diode 30 to the supply voltage, $V_s$ minus a diode forward voltage drop, "dv".

In the second phase, terminal "1" of counter 16 goes high, while "0" and "2" are low. Device 10p is turned "on", and 10n, "off". Also, device 12p is "off", device 12n is "on", device 14p is "on" and 14n is "off". The charge on capacitor 22 is stacked upon the supply voltage $V_s$ and discharged via diode 32 into capacitor 24. This action, at equilibrium after a number of clock cycles, results in capacitor 24 being charged to 2 ($V_s$-dv).

In the third phase of an operating cycle, terminal "2" of counter 16 goes "high" while "0" and "1" are low. This results in the following conditions: devices 10p, 12p and 14n being "on"; devices 10n, 12n and 14p, being "off". Thus, the charge on capacitor 22 is stacked on the supply voltage $V_s$, and the charge on capacitor 24 is stacked on that of capacitor 22, producing a level equivalent to 4 ($V_s$-dv). Capacitor 26 is charged to the last mentioned level via a path including diode 34 and N channel device 14n.

Finally in the fourth phase, terminal "3" which is "open", goes high, causing the control terminals "0", "1", and "2" to be all "low". Thus, all of the P devices, 10p, 12p and 14p are "on" and the N channel devices 10n, 12n and 14n are "off". The charge on capacitor 26 is added to the previously stacked charges as described hereinbefore, resulting in the charging of the output storage capacitor 28 via diode 36, to 8 ($V_s$-dv). This last level $V_o$ is achieved at circuit equilibrium and is maintained thereafter to supply power to load 42 via output terminals 40.

It should be noted that the highest voltage present in the CMOS switch network appears on the source electrode of P channel devices 14p, namely 4 ($V_s$-dv). The characteristics of the device require that the control inputs from counter 16 range between the P channel and N channel source voltages, that is, from ground level to 4 ($V_s$-dv). This is accomplished by operating the counter 16 from the 4 ($V_s$-dv) level as shown in FIG. 1, and clocking the counter 16 from a transistor voltage translator, 18. In order to minimize current drain, the resistance of resistor 46 in the collector circuit of transistor 18 should be large, the clock rise and fall times short, and the input pulses as narrow as practical.

In an actual operative embodiment, the CMOS units 10, 12 and 14 comprised a standard CMOS integrated circuit such as the RCA CD 4007 UB. The sequential counter 16 was implemented by appropriate interconnection of pins in a decade counter, RCA CD 4017 UB, to provide a count of 4 instead of the normal 10. It must again be emphasized that these and other circuit details which follow are presented solely for purposes of example to enable the reader to better appreciate the circuit operation. They are not to be construed as restricting the inventive concepts taught herein.

Further in the operative circuit, capacitors 22, 24 and 26 are each 0.1 microfarad, and capacitor 28 is 70 microfarads. The input clock pulse frequency is approximately 3 kHz and the input pulse width, 1 microsecond. The diodes are 1 N 4148, a general purpose type. Transistor 18 is a 2 N 3565 or 2 N 2222, or equivalent.

It should be apparent from the foregoing that the hardware simplicity of the present invention derives from the use of integrated circuits combining a number of CMOS units. Further simplicity would be achieved in a custom integrated circuit or mask programmable CMOS array wherein all of the functions described hereinbefore could be combined in a single integrated circuit.

Utilizing the foregoing circuit components and assuming $V_s$ equal to 5 volts, approximately 35 volts are produced across capacitor 28. It is obvious that the voltage loss attributable to the diode forward drops could be eliminated by replacing the diodes with suitably controlled CMOS switches. Such a modification is well within the skill of the circuit designer.

The component values used in the operative embodiment may be varied to optimize performance for a given application. Capacitors 22, 24 and 26 must be large enough to maintain their respective voltages near peak level during the respective discharge cycles, in order to prevent excessive loss of output voltage. Obviously larger output loading requires correspondingly larger values of capacitance. However the maximum useful capacitance of capacitors 22, 24 and 26 is limited by the charging time as determined by the resistance of the switching devices of the CMOS units. These resistances place a finite limit on the achievable output power. Finally, lower clock frequencies require larger capacitors and vice versa. Again, a finite upper limit to clock frequency and concomitant minimum capacitance values is imposed by the rise and fall time characteristics of the devices of the CMOS units.

Other clocking schemes suitable for driving the CMOS units 10, 12 and 14 may be utilized. Two such alternate schemes replacing the four-position sequential counter 16 of FIG. 1 are depicted in simplified form in FIGS. 2 and 3. In FIG. 2, a two stage binary counter 48 driven by clock pulses via a voltage translator, such as transistor 18 in FIG. 1, supplies binary outputs $Q_1$ and $Q_2$ to three two-input NOR gates 50a, 50b and 50c. The outputs of NOR gates 50a, 50b and 50c correspond respectively to those appearing on terminals "0", "1" and "2" of counter 16, and are applied in like manner to the CMOS units. For example if $Q_1$ and $Q_2$ are both low, the output of gate 50a is high and both 50b and 50c are low. This corresponds to the first phase of the operation cycle. When both $Q_1$ and $Q_2$ are high, all three outputs from gates 50a, 50b and 50c are low, corresponding to the fourth and final phase.

Finally, the clocking arrangement of FIG. 3 finds particular application where a microprocessor is already present in a system where DC voltage multiplication is required. Thus, by way of software programming, a latching type microprocessor output port 52, will provide when selected, a minimum of three output bits or signals derived from the data bus lines, $D_0$, $D_1$, and $D_2$. These output signals are then processed by a voltage level translator 54 (such as an RCA CD 40109), which produces on its three output terminals, "0", "1" and "2" control signals corresponding respectively to those of counter 16. An advantage of this clocking scheme is that since the four-phase sequence is developed via microprocessor software programming, the repetition rate of the sequence may be easily varied to conform to the load requirements.

In conclusion, it should be understood that changes and modifications of the arrangements described herein may be required to fit particular operating requirements. Although the invention as described employs CMOS units, the principle of operation is applicable to any suitable switching means, such as relays, mechanically operated commutators, or to other solid state devices, with appropriate modification of operating parameters. All such modifications and changes, insofar as they are not departures from the true scope of the invention are intended to be covered by the following claims.

What is claimed is:

1. A DC voltage multiplier for increasing an input supply voltage to a desired output level comprising:
    a plurality of stages required to produce said desired output level, each of said stages having a pair of switching means with complementary electrical characteristics and being coupled to each other at a common junction,
    a first stage having its pair of switching means coupled between said input supply voltage and a reference potential,
    a capacitor having a first and a second terminal, means coupling said first terminal to said common junction of said pair of switching means,
    unidirectional current conducting means coupling said second terminal of said capacitor to said input supply voltage,
    means for applying multi-phase sequential control signals having first and second predetermined amplitudes in common to the respective pairs of switching means of said plurality of stages, a signal of said first predetermined amplitude being applied sequentially to said stages such that in any given phase, said last mentioned signal is applied to the switching means of one of said stages while signals of said predetermined amplitude are applied respectively to the switching means of all the remaining stages,
    first phase control signals including said signal of said first predetermined amplitude, said last mentioned signal being applied to said switching means of said first stage and causing a first of said pair of the last mentioned switching means connected between said input supply voltage and said common junction to assume a high resistance state and the second of said pair of switching means connected between said common junction and said reference potential to assume a lower resistance state, thereby establishing a charging path for said capacitor and causing the latter to be charged substantially to the level of said input supply voltage,
    second phase control signals including a signal of said second predetermined amplitude, said last mentioned signal being applied to said switching means of said first stage and causing said first of said pair of switching means to assume a low resistance state and said second of said pair of switching means to assume a high resistance state, whereby the charge on said capacitor is stacked upon the level of said input supply voltage such that a potential substantially equal to twice that of the last mentioned voltage appears at said second terminal of said capacitor,
    at least a second stage having a second pair of switching means coupled between said second terminal of said capacitor and said reference potential,
    a second capacitor having a first and a second terminal, means coupling said first terminal of said second capacitor to said common junction of said second pair of switching means,
    a second unidirectional current conducting means coupling said second terminal of said capacitor to said second terminal of said second capacitor.

2. A DC voltage multiplier as defined in claim 1 further characterized in that said second phase control signals include said signal of said first predetermined amplitude, said last mentioned signal being applied to said switching means of said second stage and causing a first of said second pair of switching means connected between said second terminal of said capacitor and said common junction to assume a high resistance state and the second of said second pair of switching means connected between said common junction and said reference potential to assume a low resistance state, thereby establishing a charging path for said second capacitor and causing the latter to be charged substantially to twice the level of said input supply voltage, third phase control signals including signals of said second predetermined amplitude, said last mentioned signals being applied concurrently to said switching means of said first stage and said second stage and causing said first of said switching means in said first stage to remain in said low resistance state and said first of said second pair of switching means in said second stage to assume a low resistance state and further causing said second of said pair of switching means in said first stage to remain in said high resistance state and said second of said pair of second switching means in said second stage to assume a high resistance state, whereby the charge on said capacitor is stacked upon the level of said input supply voltage and the charge on said second capacitor is stacked upon the charge on said capacitor, such that a potential substantially equal to four times that of said input supply voltage appears at said second terminal of said second capacitor.

3. A DC voltage multiplier as defined in claim 2 further characterized in that in attaining said desired output level, each succeeding stage of said multiplier includes electrical connections homologous to those of said second stage and provides on its capacitor a voltage level approximately twice that present on the capacitor of the preceding stage.

4. A DC multiplier as defined in claim 3 further including an output storage capacitor and a diode, said diode coupling said second terminal of the capacitor of the last multiplier stage to said output storage capacitor whereby the latter is charged to substantially the same voltage level as that appearing on the capacitor of said last multiplier stage.

5. A DC voltage multiplier as defined in claim 4 wherein said means for applying multi-phase sequential control signals to said pair of switching means includes a sequential counter and a voltage translator coupled thereto, the operating potentials applied in common to both said sequential counter and said voltage translator being chosen to provide control signals of the proper amplitude to effect the operation of the switching means, and means for applying a train of clock pulses to said voltage translator.

6. A DC voltage multiplier as defined in claim 5 wherein said voltage translator comprises a transistor having a base, a collector and an emitter, a first resistor coupled to said base and adapted to receive said clock pulses, a second resistor coupling said collector electrode to said operating potential, said emitter electrode being connected to said ground potential, and said collector electrode being coupled to said sequential counter.

7. A DC voltage multiplier as defined in claim 4 wherein said means for applying multi-phase sequential control signals to said pair of switching means includes a two-stage binary counter and a voltage translator, means for applying a train of clock pulses to said voltage translator, a plurality of two-input NOR gates coupled to the output of said binary counter, said NOR gates providing at any given time respective control signals in accordance with the current phase of the operational cycle.

8. A DC multiplier as defined in claim 4 wherein said means for applying multi-phase sequential control signals to said pair of switching means includes a microprocessor output port and a voltage translator, said microprocessor output port being coupled to said voltage translator and outputting thereto a plurality of signals derived from its data bus lines, said voltage translator further providing to the pairs of switching means in the multiplier stages control signals of proper amplitude to effect the operation of the latter means.

9. A DC voltage multiplier as defined in claim 5 wherein each of said pairs of switching means in a CMOS unit, comprising a P and an N channel device.

10. A DC voltage multiplier as defined in claim 9 wherein each of the first of a pair of switching means is a P channel device and the second of said pair of switching means is an N channel device, the respective drain electrodes of said P channel device and said N channel device being coupled to each other to form said common junction, said control signals being applied in common to the respective gate electrodes of the P and N channel devices, the source electrode of each N channel device being coupled to said reference potential and the source electrode of each P channel device being coupled to respective voltage levels derived from said supply voltage, during the multiplier operation.

11. A DC voltage multiplier as defined in claim 10 wherein each of the unidirectional current conducting means is a diode.

12. A DC voltage multiplier as defined in claim 11 further including a pair of output terminals connected across said output storage capacitor, one of said output terminals being further connected to said reference potential, and a load coupled across said output terminals.

* * * * *